United States Patent [19]

Gleichmann et al.

[11] Patent Number: 5,293,896
[45] Date of Patent: Mar. 15, 1994

[54] ARRANGEMENT FOR MEASURING THE LEVEL OF LIQUIFIED GASES

[75] Inventors: Lüder Gleichmann, Ilmenau; Gerd Löbel, Berlin, both of German Democratic Rep.

[73] Assignee: Balzers Aktiengesellschaft, Balzers, Liechtenstein

[21] Appl. No.: 619,230

[22] Filed: Nov. 28, 1990

[51] Int. Cl.⁵ .................. G01F 23/22; G05D 9/12; F16K 37/00
[52] U.S. Cl. .................. 137/392; 62/49.2; 73/295; 116/109; 116/227; 137/558; 257/87; 340/619
[58] Field of Search .................. 137/392, 558; 62/49.1, 62/49.2; 73/295, 304 R; 257/87, 90, 102; 313/498, 499; 340/619, 620; 116/109, 202, 216, 227

[56] References Cited

U.S. PATENT DOCUMENTS

| | | | |
|---|---|---|---|
| Re. 29,845 | 11/1978 | Groves et al. | 257/87 |
| 3,603,833 | 9/1971 | Logan et al. | |
| 3,875,473 | 4/1975 | Lebailly | 313/499 |
| 3,927,344 | 12/1975 | Lebailly | 313/499 |
| 3,931,631 | 1/1976 | Groves et al. | 257/87 |
| 4,001,056 | 1/1977 | Groves et al. | 257/87 |
| 4,069,838 | 1/1978 | Hansel et al. | 137/392 |
| 4,135,548 | 1/1979 | Sears | 137/392 |
| 4,224,632 | 9/1980 | Iwamoto et al. | 257/87 |
| 4,404,809 | 9/1983 | Johnson et al. | 137/392 |
| 4,445,238 | 5/1984 | Maxhimer | 137/392 |
| 4,510,515 | 4/1985 | Kajita et al. | 257/87 |
| 4,635,668 | 1/1987 | Netter | 137/392 |
| 5,041,883 | 8/1991 | Lindquist et al. | 257/102 |

FOREIGN PATENT DOCUMENTS

| | | |
|---|---|---|
| 0360405 | 8/1989 | European Pat. Off. . |
| 1809820 | 7/1969 | Fed. Rep. of Germany . |
| 3925927 | 5/1990 | Fed. Rep. of Germany . |
| 203143 | 10/1983 | German Democratic Rep. . |
| 0162004 | 10/1982 | Japan ................ 137/392 |

OTHER PUBLICATIONS

Ben'yaminovich et al., "A Liquid nitrogen level regulator", Jun. 1972, vol. 12 No. 3 (GB).
Sandhu et al. "An Inexpensive Automatic Liquid Nitrogen Level Control System using an Integrated Circuit", Mar./Apr. 1971 pp. 424–425.

Primary Examiner—George L. Walton
Attorney, Agent, or Firm—Notaro & Michalos

[57] ABSTRACT

A semiconductor sensor detects the existence of liquified gases by immersion or approaching the liquid. A high signal amplitude of the sensor permits a simple signal evaluation of high reliability. The sensor permits the realization of filling level measuring devices or level control devices for liquified gases.

8 Claims, 2 Drawing Sheets

ARRANGEMENT FOR MEASURING THE LEVEL OF LIQUIFIED GASES

FIELD AND BACKGROUND OF THE INVENTION

The present invention can be used anywhere for measuring the level of liquified or liquid gases, especially liquid nitrogen, liquid oxygen or liquid helium, or for detecting the presence of such liquified gases.

According to German patent application DE 39 25 927, European patent application EP 0 360 405, East German patent document DD 203 143 and U.S. Pat. No. 4,404,809, arrangements for measuring or controlling the level of liquified gases are known. Sensors, such as specially produced deposited carbon resistors, light-barriers, resistor thermometers, semiconductor diodes, swimmers and pressure gauges with heaters and contacts are used to find the level of such liquids, are known. A level control for instance consists of a three-way valve, a controlling device and a liquid gas container as well as a second liquid gas container wherein the liquid level is kept constant. A three-way valve is operated by means of a controlling device which during the filling operation keeps the liquid gas container's evaporation vent closed and by means of a heater in the container, creates pressure that feeds the liquid gas to the second container. Other arrangements do not use a heater but a pressure gas that is fed from the exterior, sometimes also by compressed air.

These arrangements have the following disadvantages:

The arrangement shown in the U.S. Pat. No. 4,404,809 needs two times four exactly selected resistors to build bridge circuits. With the arrangement used in the patent specification DD 203,143 it is possible that parts of the construction will be covered by ice which makes them nontransparent to optical beams (also infrared). Mechanical swimmers often freeze solid due to the temperatures used, and contacts often shown signs of corrosion because parts that were cooled down to low temperatures tend to steam up (water vapor in the air freezes out and thereafter defrosts). When using temperature dependent resistors as the sensors, unfortunately only small signal changes take place. The use of a traditional semiconductor diode also shows only small changes in its forward voltage depending on the temperature. The forward voltage lies at about 2 mV per 1° Kelvin temperature change. The evaluation of such sensor signals is therefore very costly and strongly limits the measuring precision and reliability of the device.

SUMMARY OF THE INVENTION

It is an object of the present invention to create an arrangement that avoids the above-mentioned disadvantages. The invention is based on the task of creating a special sensor to control the gas level with high signal amplitude and high reliability for the level control of liquified gases which permits simple, highly reliable control arrangements.

The characteristic curve of the inventive sensor signal should have such an inclination and sensitivity that a fast rise of the electric signal takes place only in case of its immersion into or direct heat exchange contract with the liquid gas (forward voltage $U_F$, of 8–12 V). The measurement of this rise is possible with simplified electronic circuits, and can be handled reliably with simple threshold value switches.

The invention resolves this task by using light emitting diodes or other pn junctions on a GaP or GaAsP-base as the level sensors. In case the pn junction is doped with $N_2$, green and yellow shining light emitting diodes are especially suitable, with temperatures below $-50°$ C. This surprisingly leads to a strong temperature dependent nonlinearity of the forward voltage ($U_F$). The forward voltage usually lies at approximately 2 V. At a temperature of $-196°$ C., usually there are forward voltages of about 8–12 V. The special characteristic of this high forward voltage only appears if the parts are immersed, which is a consequence of the changes within the pn junction. 1 or 2 mm above the liquid gas level, this high forward voltage already has sunk to 3 to 4 V. The power supply for the light emitting diode is operated from a constant current source. Another characteristic is the fact that a change of the emitted light takes place. A green shining luminous diode changes its light into a yellowish color; a yellow light changes into a greenish one. This effect also is reduced immediately if the sensor is placed at 1 to 2 mm above the liquid gas level. This spectral light change can also be used to find the level of the liquid gas. To reach this aim, light transmittent filters are either placed on the light emitting diode, on the photo receiver or between these two element. When used with a level controlling system, corresponding timers within the controlling device guarantee that the liquid gas level is actually held at the given height. Short time disturbing impulses can be cut off by means of a low-pass filter.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF THE PREFERRED EMBODIMENT

Figure 1:
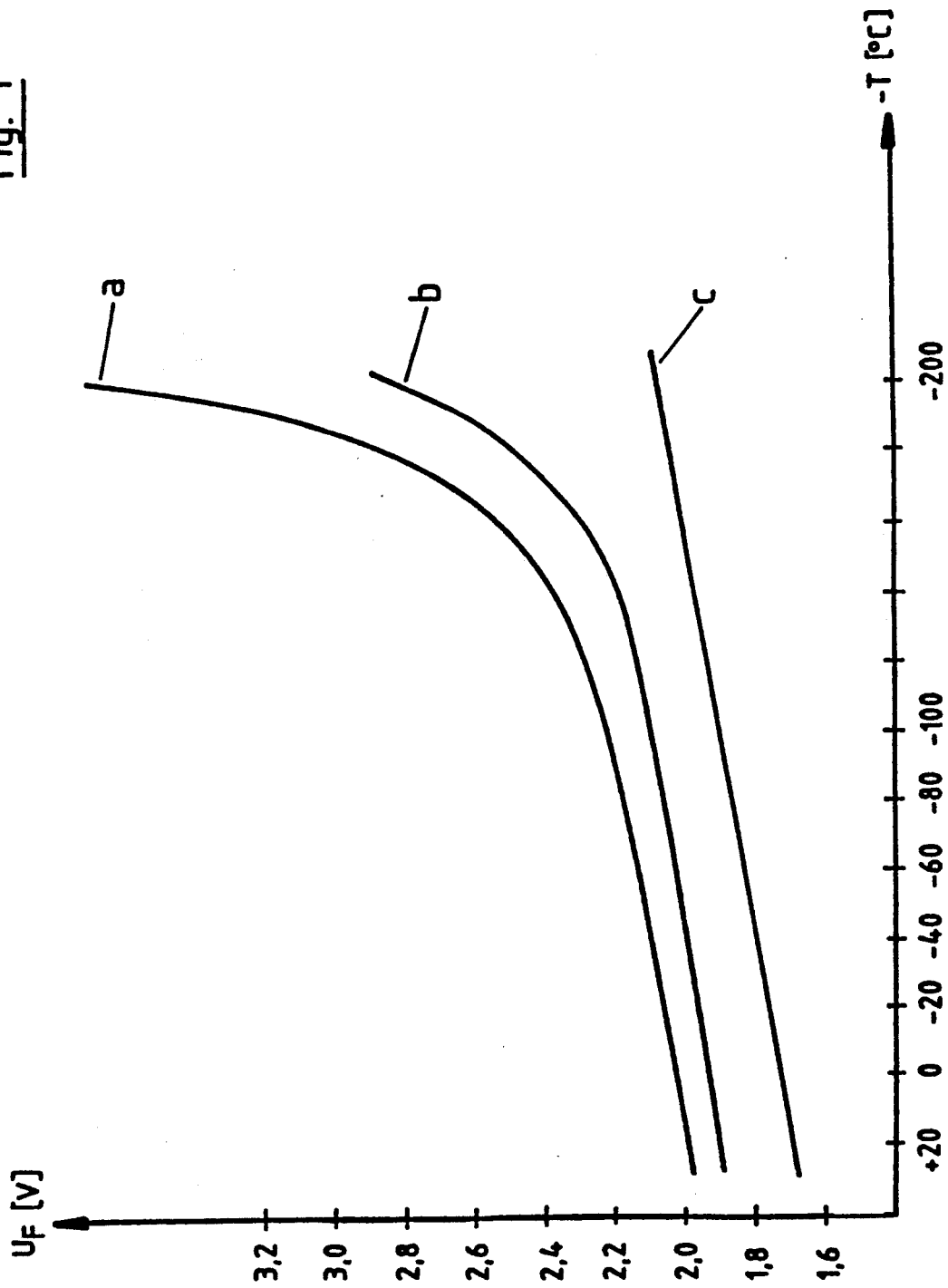
FIG. 1 is a graph plotting forward biasing voltage against temperature for three light emitting diodes, two being of the present invention.

FIG. 1 shows the forward voltage ($U_F$) values of different diodes a, b and c, depending of the temperature T at the diodes. The curves for diodes a and b show a strong nonlinear behavior. At about $-50°$ C., the forward voltage ($U_F$) already starts to rise overproportionally. Within the range of temperatures around $-200°$ C. the measured voltage values are many times higher than the original ones. When measuring the above mentioned values, the diodes were supplied with a constant current of 10 mA. Both diodes a and b were Ga based pn structures doped with nitrogen. The characteristic curve a is for a green light emitting diode and the characteristic curve b is for a yellow one. The curve c, however, reacts like a red light emitting diode without nitrogen doping.

Figure 2:
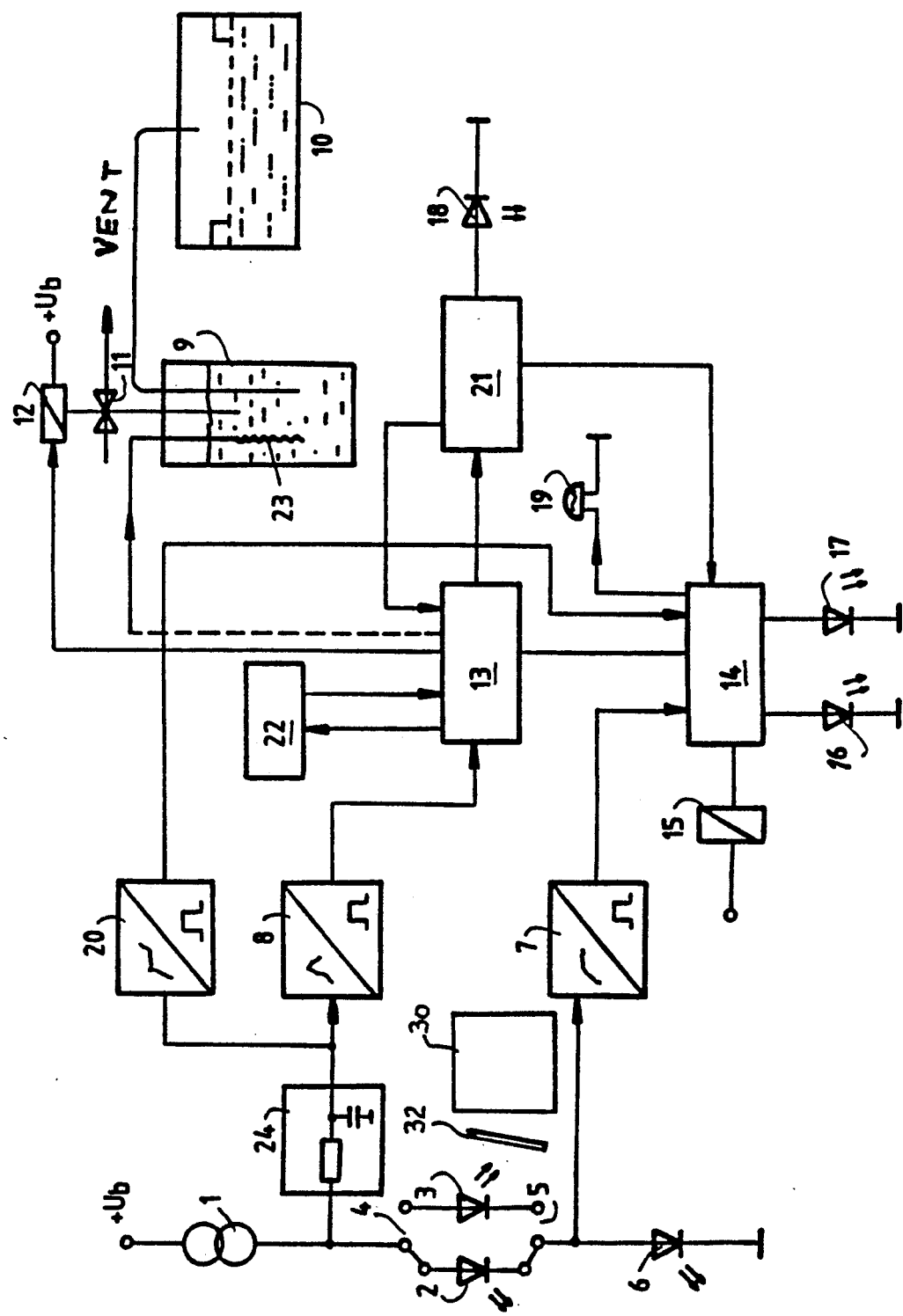
FIG. 2 is a schematic diagram showing a circuit for operating the sensor of the present invention.

FIG. 2 shows a practical example of a refilling device for liquid gas according to the invention.

Starting from a current source 1, current is supplied to a light emitting diode 6 over a switch 4 through a sensor 2 and then through a switch 5. The sensors 2 and 3 hereby consist of either green or yellow emitting pn junctions (light emitting diodes) and are to be positioned in the liquid gas tank 10. A threshold detector 7 is adjusted in a way that in case of a power breakdown of the current source 1, an alarm signal is generated and the switches 4 and 5 are brought into their position connecting diode 3 by a relay 15 which controls the switch position. The sensor 3 is then switched on. Alarm logic 14 evaluates the situation and, depending on the sensor which is switched on, powers the light emitting diode 16 or a light emitting diode 17 to flash and indicate the circuit status. If a threshold detector switch 20 indicates that a fixed upper voltage level has been surpassed, the alarm logic 14 also receives a signal and the switches 4 and 5 switch from sensor 2 to sensor 3. If both sensors 2 and 3 are defective, the alarm logic 14 indicates this optically by means of the luminous diode 16 and 17 as well as acoustically by means of an acoustic transducer 19.

If the liquid gas level within the working container sinks so low that the sensors 2 or 3 (depending on which sensor is switched on by means of the switches 4 and 5) no longer are in touch with the liquid level, a threshold detector 8 emits a signal to a controlling logic 13. A three-way valve 11 switches from the "evaporation" position to the "fill in compressed air" position. In this case, a container 9 which is sealed toward the exterior supplies liquified gas which is lead to the container 10 by means of an over-flow pipe from tank 9 to tank 10 so that the liquid again touches the sensors 2 and 3 when the wanted liquid gas level is reached. Depending on which sensor (2 or 3) is activated by means of the alarm logic 14, the control logic 13 receives a message that the upper level has been reached again.

To prevent misinterpretations provoked by liquid gas splashes, singular short impulses are suppressed by a low-pass filter 24. When a permanent liquid gas level is reached by the sensors 2 and 3, the logic 13 releases a timer 22. This timer fixes a certain refilling period. The period is chosen so that with normal functioning, the quantity of refilled liquid gas permanently ensures that the sensors 2 and 3 are immersed. The time limit of the timer 22 is always smaller than a time limit 21. If the time limit of the timer 22 has run out, the valve 11 is again positioned in its resting position by means of a positioning device 12 operated by the controlling logic 13.

When releasing the valve 11, the controlling logic also releases the timer 21. Timer 21 determines the maximally possible filling time. If the rise of the liquid gas level is not reached within the period given by the timer, the timer 21 indicates an unpermitted operating mode to the alarm logic 14. This is meant to check if the container 9 is empty, if the compressed air is missing, if the tube between the tanks is covered by ice etc. If the maximally possible filling time given by the timer 21 is surpassed, the alarm logic 14 also receives a signal and a light emitting diode 18 is constantly illuminated. The acoustic transducer 19 is activated at the same moment. The normal filling operation is indicated by the flashing of the optical signal 18.

Instead of using compressed air on valve 11 for tank 9, it is also possible to use a heater 23 placed within the container 9 which produces pressure by evaporating liquid gas. The operating mode of valve 11 otherwise is the same.

The several operating states of the arrangement are indicated to the exterior by means of the optical signals 16 and 17 (LED's) and the acoustic transfer 19.

The diodes 2 and 3 may be placed at different levels within the tank of liquified gas and may cooperate with a photo receiver 30 that is tuned to the spectral emission character of the sensors. At least one optical filter 32 for tuning the photo receiver is provided either at the photo receiver or at the sensor or between the two. The sensor, photo receiver and filter element may be built as a single compact unit.

While a specific embodiment of the invention have been shown and described in detail to illustrate the application of the principles of the invention, it will be understood that the invention may be embodied otherwise without departing from such principles.

What is claimed is:

1. An arrangement in combination with cryogenic liquified gas for indicating when the cryogenic liquified gas reaches a predetermined level within a container comprising:

at least one light emitting diode acting as a coil-free sensing element and having a pn structure on one of a GaP and a GaAsP base which is doped with nitrogen so that, because said at least one diode is doped with nitrogen, it has a characteristic such the temperatures below $-50°$ C. as the cryogenic liquified gas approaches the diode, causes non-linearity of a forward voltage for the nitrogen doped diode, said at least one diode being placed adjacent the predetermined level so that when the level of the liquified gas is rising and approaches the diode, said diode is exposed to a changing low temperature due to the rising liquified gas to generate an indication signal which is characteristic for said diode;

a control logic unit connected to said diode for receiving and acting upon the indication signal which is dependent on the temperature of said diode, said indication signal always being a forward voltage change greater than 1 Volt and the voltage change increasing continuously in a non-linear manner as temperature decreases continuously downwardly from $-50°$ C., the relationship between forward voltage and dropping temperature being a non-linear relationship with continuously increasing slope for temperatures below $-50°$ C.

2. An arrangement according to claim 1 including at least one additional diode having an additional pn structure on a said one of a GaP and GaAsP base, the additional pn structure being doped with nitrogen, the first mentioned and additional diodes being positioned at different predetermined levels for measuring the level of liquified gas in at least two steps corresponding to the levels of the first mentioned and additional diodes.

3. An arrangement in combination with cryogenic liquified gas for indicating when the cryogenic liquified gas reaches a predetermined level within a container comprising:

at least one light emitting diode acting as a coil-free sensing element and having a pn structure on one of a GaP and a GaAsP base which is doped with nitrogen so that, because said at least one diode is doped with nitrogen, it has a characteristic such the temperatures below minus 50° C. as the cryogenic liquified gas approaches the diode, causes non-linearity of a forward voltage for the nitrogen doped diode, said at least one diode being placed adjacent to predetermined level so that when the level of the liquified gas is rising and approaches the diode, said diode is exposed to a changing low temperature due to the rising liquified gas to the rising liquified gas to generate an indicational light signal which is characteristic for said diode, said diode being a light emitting diode; and a control logic unit connected to said diode for receiving and acting upon the indication light signal which is dependant on the temperature of said diode, said control logic unit including means for detecting a spectral change of light being emitted by said diode when the cryogenic liquified gas approaches the diode, the at least one diode having a forward voltage change that increases continuously in a non-linear manner as temperature increases continuously downwardly from −50° C., the relationship between the forward voltage and the dropping temperature being a non-linear relationship with continuously increasing slope for temperatures below −50° C.

4. An arrangement according to claim 3 wherein the evaluation unit comprises at least one photo receiver which is tuned to a spectral emission characteristic of the light emitting diode.

5. An arrangement according to claim 4 including at least one optical filter between the photo receiver and the light emitting diode for tuning light from the light emitting diode.

6. An arrangement according to claim 5 including, in combination, a container containing said predetermined level, and wherein the diode is light emitting, the photo-receiver and the filter are built as a single compact unit placed within the container and exposed to the rising level of liquified gas.

7. An arrangement according to claim 3 including at least one additional diode having an additional pn structure on a said one of a GaP and GaAsP base, the additional pn structure being doped with nitrogen, the first mentioned and additional diodes being positioned at different predetermined levels for measuring the level of liquified gas in at least two steps corresponding to the levels of the first mentioned and additional diodes.

8. An arrangement according to claim 3 wherein the evaluation unit includes refilling control means which respond to a signal from the diode for refilling a level of liquified gas.

* * * * *